United States Patent [19]

Hozumi et al.

[11] Patent Number: 5,356,825
[45] Date of Patent: Oct. 18, 1994

[54] METHOD OF MANUFACTURING SEMICONDUCTOR DEVICES

[75] Inventors: Hiroki Hozumi; Shinichi Araki, both of Tokyo, Japan

[73] Assignee: Sony Corporation, Tokyo, Japan

[21] Appl. No.: 752,592

[22] PCT Filed: Dec. 26, 1990

[86] PCT No.: PCT/JP90/01698

§ 371 Date: Sep. 26, 1991

§ 102(e) Date: Sep. 26, 1991

[87] PCT Pub. No.: WO91/10262

PCT Pub. Date: Jul. 11, 1991

[30] Foreign Application Priority Data

Dec. 26, 1989 [JP] Japan ............... 1-337007

[51] Int. Cl.⁵ ............................... H01L 21/70
[52] U.S. Cl. .................... 437/60; 437/47; 437/241; 437/918; 148/DIG. 136
[58] Field of Search ............ 437/60, 47, 918, 937, 437/40, 247; 148/DIG. 136

[56] References Cited

U.S. PATENT DOCUMENTS 4,916,507 4/1990 Boudou et al. ............... 437/918

FOREIGN PATENT DOCUMENTS

| 0145926 | 6/1985 | European Pat. Off. | ............ 437/918 |
| 54-44880 | 4/1979 | Japan . | |
| 55-8026 | 1/1980 | Japan . | |
| 61-96756 | 5/1986 | Japan . | |
| 63-151064 | 6/1988 | Japan | ............ 437/918 |
| 63-155755 | 6/1988 | Japan | ............ 437/918 |
| 63-248157 | 10/1988 | Japan | ............ 437/918 |

Primary Examiner—Brian Hearn
Assistant Examiner—Michael Trinh
Attorney, Agent, or Firm—Hill, Steadman & Simpson

[57] ABSTRACT

A resistor (45) of semiconductor material is formed on an insulating layer (42), then a silicon nitride film (46) is deposited on the entire surface including the resistor (45), and a silicon dioxide film (47) is sequentially deposited thereon, and thereafter electrodes (49A) and (49B) of the resistor (45) are formed, thereby preventing the fragility of the insulating layer (51) at step portions of the resistor (45), preventing the breakage of the electrodes and interconnections, and improving a withstand voltage between the resistor (45) and the interconnections crossing over it to thereby improve yield of a semiconductor device. An impurity (64) is introduced into a semiconductor film (63) to be a resistor by the ion implantation technique to thereby change the state of the film into an amorphous state, semiconductor film (63a) is heated in atmosphere including hydrogen compound gas and/or hydrogen gas, and then heated to activate it to thereby form a resistor (67), so that a resistance value of the resistor (67) at a region where the impurity is highly dosed can be decreased progressively.

1 Claim, 10 Drawing Sheets

METHOD OF MANUFACTURING SEMICONDUCTOR DEVICES

TECHNICAL FIELD

The present invention relates to a method of manufacturing semiconductor devices and particularly to a method of manufacturing resistors using a polycrystalline semiconductor layer.

BACKGROUND ART

It has been mainly employed, as a resistor for a semiconductor device, a diffusion resistor which uses a diffusion layer formed in a semiconductor substrate as a resistor The diffusion resistor is constituted in such a manner that boron is doped to a surface portion of, for example, an n-type epitaxial layer to form a p+ diffusion region, then electrodes (e.g., Al electrodes and so on) are formed at opposite ends of the diffusion region.

In recent years, a polycrystalline silicon resistor which uses a polycrystalline silicon film as a resistor has been employed. The polycrystalline silicon resistor is constituted in a manner as shown in FIG. 6 that a polycrystalline silicon film 3 including impurities serving as a resistor is formed on a field insulating layer ($SiO_2$ layer) 2 formed on a major surface of a silicon substrate 1, thereafter an $SiO_2$ layer 4 is deposited on the entire surface of the polycrystalline silicon film 3 by the chemical vapor deposition (CVD) process, then a pair of Al electrodes (interconnections) 6 are formed on opposite ends of the polycrystalline silicon film 3 through contact holes. Thus constructed polycrystalline silicon resistor 7 has the following features when compared with the above-described diffusion resistor:

(i) the diffusion resistor has such a property that a resistance value changes depending on a depletion layer, so-called back bias dependence, since a junction is separated by applying a reverse bias voltage between it and the neighboring semiconductor region, while the polycrystalline silicon resistor 7 does not have such a back bias dependence;

(ii) the diffusion resistor has such a property that an expansion of a depletion layer is changed depending on a voltage applied thereto to thereby change a resistance value, so-called self bias dependence, while the polycrystalline silicon resistor 7 does not have such a self bias dependence;

(iii) the diffusion resistor is changed in its resistance value depending on the orientation of a wafer and by the influence of stress applied thereto in the assembling-process (e.g., in the molding process), while the polycrystalline silicon resistor 7 is not influenced in its resistance value by the orientation of a wafer and little influenced by the stress in the assembling process; and (iv) the polycrystalline silicon resistor is more advantageous in the temperature characteristics.

Now, as one of bipolar transistors, there has been proposed a ultra-high speed bipolar transistor which is constructed in a manner that both a base leading-out electrode and an emitter leading-out electrode are formed by a polycrystalline silicon film, then a base region and an emitter region are formed in a self-alignment fashion by diffusing impurities from the polycrystalline silicon film serving as the emitter leading-out electrode. FIG. 8 illustrates an example of methods of manufacturing the ultra-high speed bipolar transistor. As shown in FIG. 8A, on a major surface of a first conductivity type, e.g., p-type silicon substrate 11, a second conductivity type, e.g., n-type collector buried region 12 and a p-type channel stopper region 13 are formed, then an n-type epitaxial layer 14 is grown thereon. Thereafter, a highly-doped n-type collector leading-out region 15 reaching to the collector buried region 12 is formed, and a field insulating film 16 is formed by the local oxidation on the regions except for the collector leading-out region 15 and a region 14A on which base and collector regions are formed in the succeeding processes. Then, a thin insulating layer, e.g., $SiO_2$ layer 17 is formed on an entire surface thereof, and a portion thereof corresponding to the region 14A is opened to form a first polycrystalline silicon layer 18 serving as a base leading-out electrode by the CVD process, then boron acting as p-type impurities is doped to the polycrystalline silicon film 18. Thereafter, the p+ polycrystalline silicon film 18 is subjected to the patterning process by a first resist mask 19 having a pattern corresponding to the external configuration of the base leading-out electrode.

Referring to FIG. 8B, an $SiO_2$ film 20 is deposited by the CVD process on an entire surface including the p+ polycrystalline silicon film 18 having been subjected to the patterning process, and thereafter a second resist mask 21 is formed thereon. A part of the $SiO_2$ film 20 and the P+polycrystalline silicon film 18 corresponding to an active portion so as to form an intrinsic base region and an emitter region is selectively removed by the etching-process through the resist mask 21 to thereby form an opening 23 and also to form a base leading-out electrode 22 formed of the p+ polycrystalline silicon film 18.

Then, as shown in FIG. 8C, p-type impurity boron is implanted by the ion implantation technique through the opening 23 to form a link base region 24 on the region 14A for connecting an external base region and the intrinsic base region which are to be formed. An $SiO_2$ film is then deposited by the CVD process and the above deposited $SiO_2$ film by the CVD is densified by the heat treatment at about 900° C. Due to the heat treatment at this time, the impurity boron from the base leading-out electrode 22 of the P+ *polycrystalline silicon film is diffused to form a part of an external base region 26. Then, by the etch back-process a side wall 25 of $SiO_2$* is formed at the inner wall of the base leading-out electrode 22 facing to the opening 23.

Thereafter, as shown in FIG. 8D, a second polycrystalline silicon film 28 finally serving as the emitter leading-out electrode is formed by the CVD process at an opening 27 defined by the side wall 25, and p-type impurity (e.g., B or $BF_2$) is implanted by the ion implantation process into the polycrystalline silicon film 28 which is in turn annealed to form a p-type intrinsic base region 29 at the active portion, then n-type impurity (e.g., arsenic) is implanted into the film by the ion implantation process and annealed to form an n-type emitter region 30. The p-type intrinsic base region 29 and the n-type emitter region 30 may be formed instead of the above-described method in a manner that the p-type impurity and the n-type impurity are sequentially implanted into the polycrystalline silicon film 28 by the ion implantation process and simultaneously annealed. Due to the annealing-process, for forming the base and emitter electrodes, the impurity boron from the base leading-out electrode 22 of the P+ polycrystalline silicon film is diffused to finally form the external base region 26.

Now, the intrinsic base region 29 is higher in the impurity density than that of the link base region 24. Thereafter, contact holes are formed, and then a base electrode 31, a collector electrode 32 and an emitter electrode 33 are formed by metal (e.g., Al), thereby constituting a ultra-high speed bipolar transistor 34.

The above-described polycrystalline silicon resistor is used in a ultra-high speed bipolar LSI, Bi-CMOS LSI etc. including the above-described ultra-high speed bipolar transistor.

However, since the above-described polycrystalline silicon resistor is formed on the field insulating layer 2, a step becomes larger, whereby interruption of the step and electromigration may occur at the Al electrode (interconnection) 6 of the upper layer due to the coverage of the CVD $SiO_2$ film 4 at a step portion A in FIG. 6. Further, since the CVD $SiO_2$ film 4 at the step portion A is fragile from a film quality standpoint, when the Al interconnection 8 crosses over the resistor 7 as shown in FIG. 7, a leak current may be generated between the polycrystalline silicon resistor 7 and the Al interconnection 8 at a step portion B.

The reason that the quality of the CVD $SiO_2$ film 4 is degraded is considered as follows. Namely, when the polycrystalline silicon film 3 to be the resistor is subjected to the patterning process by, for example, the reactive ion etching (RIE) process through the resist mask, a surface of the field insulating layer 2 is damaged, and a surface of the polycrystalline silicon film 3 is polluted and damaged when the ashing of the resist mask is performed, so that the CVD $SiO_2$ film 4 formed on the polycrystalline silicon film becomes thin in thickness and becomes fragile.

Now, in the case of the polycrystalline silicon resistor, a sheet resistance value thereof can be controlled in accordance with the kinds of impurities and an amount of dose when the thickness thereof is fixed. However, even though boron (B), arsenic (As) and phosphor (P) etc., have various characteristics, but each of these impurities has such a common tendency that when an amount of dose of the impurities is increased more than a predetermined value, a sheet resistance value is not decreased but increased due to the segregation of the impurities, etc. FIG. 4 is a graph illustrating dependence of the sheet resistance on an amount of dose of boron, wherein a curve $a_2$ shows a conventional case. FIG. 5 is a graph illustrating dependence of the sheet resistance on an amount of dose of arsenic or phosphor, wherein a curve $b_2$ shows a conventional case. As is clear from these drawings, it has been difficult to obtain a low resistance value by using the polycrystalline silicon resistor with a thin film (which is normally used to obtain a high resistance value).

Accordingly, in view of the above-described drawbacks of the conventional manufacturing method, an object of the present invention is to provide a method of manufacturing semiconductor devices which is capable of forming a stable insulating film with a good quality and forming a resistor with high reliability which does not cause an interruption of a step of electrodes and interconnections or a leak current between the resistor and the interconnections.

Another object of the present invention is to provide a method of manufacturing semiconductor devices which is capable of obtaining a resistor with a lower resistance value in a highly dosed region.

DISCLOSURE OF INVENTION

According to a manufacturing method of a resistor of the present invention, a resistor 45 made of a semiconductor film is formed on an insulating layer 42, then a silicon nitride film 46 is deposited on the entire surface including the resistor 45 and, further a silicon dioxide film 47 is sequentially deposited thereon. Thereafter, electrodes 49A and 49B for the resistor 45 are formed. According to this manufacturing method, even if a surface of the insulating layer 42 is damaged in the patterning process of the resistor 45, and a surface of the resistor 45 is damaged and polluted in case of removing a resist mask by the ashing process, the silicon nitride film 46 on the resistor can be formed with a good coverage and fine film quality, so that, by forming the silicon dioxide film 47 through the silicon nitride film 46, the silicon dioxide film 47 with a good film quality can be formed and so a stable insulating film 51 with a good coverage as a whole can be formed. Thus, the interruption of a step of electrodes and interconnections and electromigration due to the coverage of the insulating film 51 can be prevented. Further, a withstand voltage between the resistor 45 and interconnections crossing over the resistor 45 is improved to prevent the generation of a leak current therebetween. Thus, a resistor with high reliability can be manufactured and the yield of the semiconductor device can be improved.

Further, according to a manufacturing method of resistors of the present invention, an impurity 64 is injected into a semiconductor film 63 to be a resistor by the ion implantation technique to thereby change the state of the film into an amorphous state, and a semiconductor film 63a is heated in atmosphere including hydrogen compound gas and/or hydrogen gas, and further heated to activate it to thereby form a resistor 67. The heat treatment in the atmosphere including the hydrogen compound gas and/or hydrogen gas is performed at a middle temperature range of about 500° to 800° C. As the hydrogen compound gas, $NH_3$, HCl, $SiH_4$ or $SiH_2Cl_2$ gas etc., may be used. The heating process for the activation is performed in gas atmosphere such as $N_2$ gas at a high temperature range of more than 900° C.

Thus, the impurity 64 is introduced into the semiconductor film 63 to be a resistor by the ion implantation technique to change the state of the film into an amorphous state, and the semiconductor film 63a is heated in atmosphere including hydrogen compound gas and/or hydrogen gas before the heat treatment for the activation, so that a resistance value of the resistor 67 at a region where the impurity is heavily dosed can be decreased progressively. As a result, the degree of freedom for designing a resistance value of a resistor of a semiconductor film in the semiconductor device can be widened.

BEST MODE FOR CARRYING OUT THE INVENTION

Embodiments of the present invention will be described with reference to the accompanying drawings.

FIG. 1 shows an example of methods of manufacturing the semiconductor device, particularly, a resistor thereof according to the present invention.

Figure 1A:
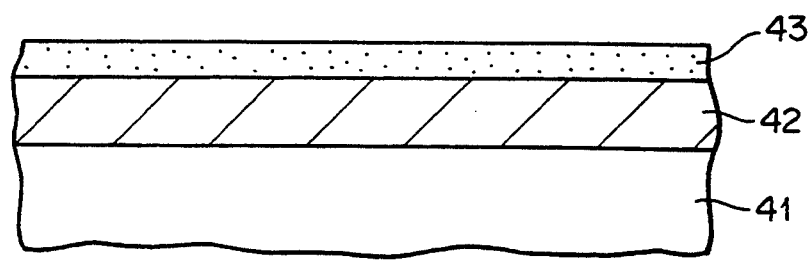
FIGS. 1A to 1D are diagrams illustrating one embodiment of manufacturing processes of a resistor according to the present invention.

In this example, as shown in FIG. 1A, a field insulating layer 42 is formed on a major surface of a semiconductor substrate, e.g., silicon substrate 41, and a polycrystalline silicon film 43 having a thickness of about 1000 to 4000Å is deposited on the field insulating layer 42 by the CVD process. The field insulating layer 42 may be made of an $SiO_2$ layer formed by a process, e.g., local oxidation (LOCOS) or CVD process.

Figure 1B:
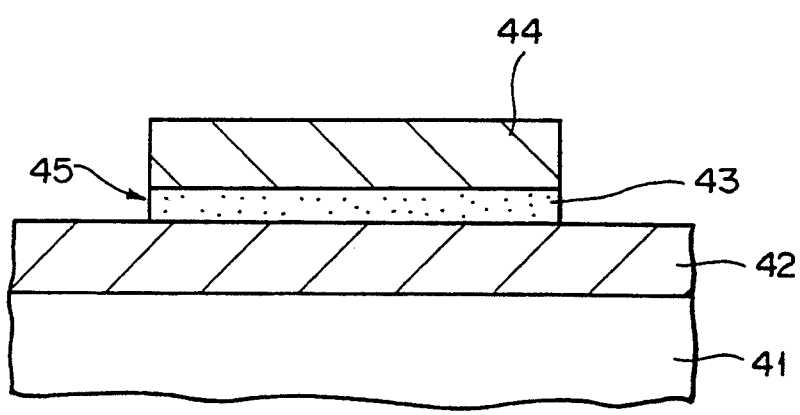

Referring to FIG. 1B, an impurity, e.g., boron is introduced to the polycrystalline silicon film 43 by the ion implantation technique, then a resist mask 44 is formed selectively on a region of the polycrystalline silicon film 43 to be a resistor by the photolithography technique, and the region is subjected to the patterning process through the resist mask 44 by a process, e.g., RIE process to thereby form a resistor body 45.

Figure 1C:
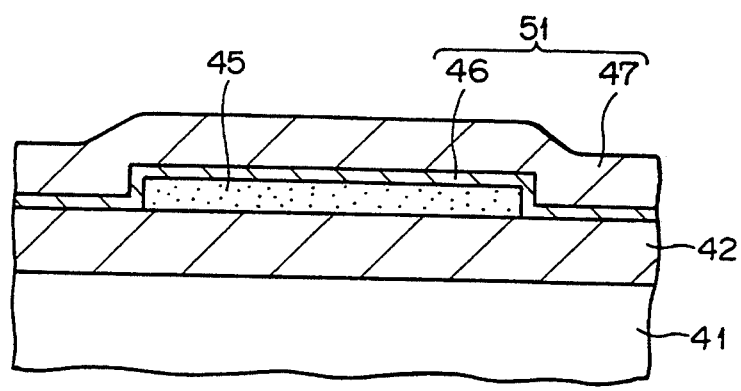

Next, as shown in FIG. 1C, the resist mask 44 is exfoliated by the ashing process, and a silicon nitride ($Si_3N_4$) film 46 is deposited on the entire surface of the device including the resistor body 45 by the low pressure CVD process at a temperature of 700° C., for example, and then a silicon dioxide ($SiO_2$) film 47 is deposited thereon by the normal pressure CVD process at a temperature of 350° C., for example. The silicon nitride film 46 can be formed as a dense film even on the field insulating layer 42 which has been damaged in the patterning process of the polycrystalline silicon film and on the surface of the resistor body 45 which has been polluted and damaged in the ashing process of the resist mask, thereby providing a good coverage and less pin holes. Thus, the silicon dioxide film 47 formed on the silicon nitride film 46 with the good film quality can also be formed stably to have a good film quality.

Figure 1D:
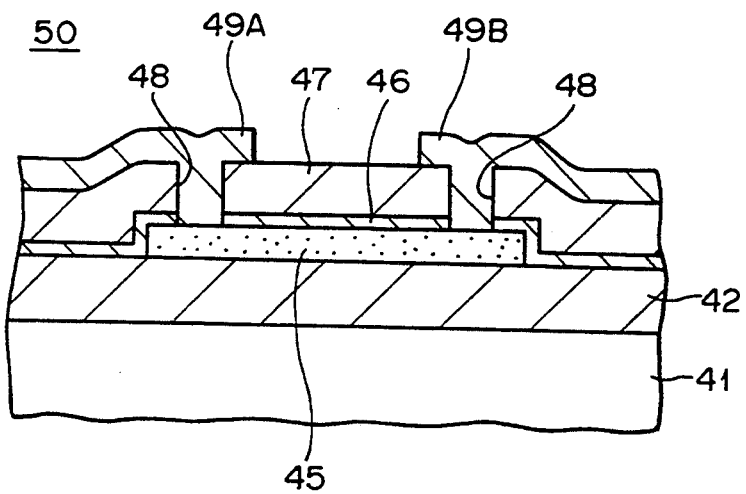

Thereafter, both the silicon dioxide film 47 and the silicon nitride film 46 are selectively removed to form a pair of contact holes 48 at their portions corresponding to opposite ends of the resistor body 45, and Al, for example, is formed thereon by the sputtering-process and then this is subjected to the patterning process to form a pair of electrodes 49A and 49B at opposite ends of the resistor body 45, thereby obtaining a target polycrystalline silicon resistor 50 shown in FIG. 1D by the sintering process.

Figure 7:
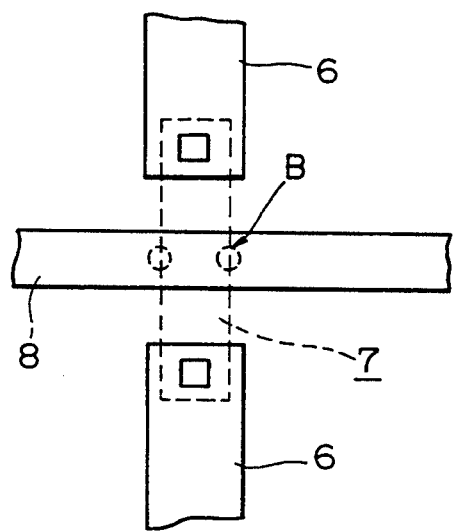
FIG. 7 is a plan view illustrating a state where an interconnection is crossing over the polycrystalline silicon resistor.
Figure 8A:
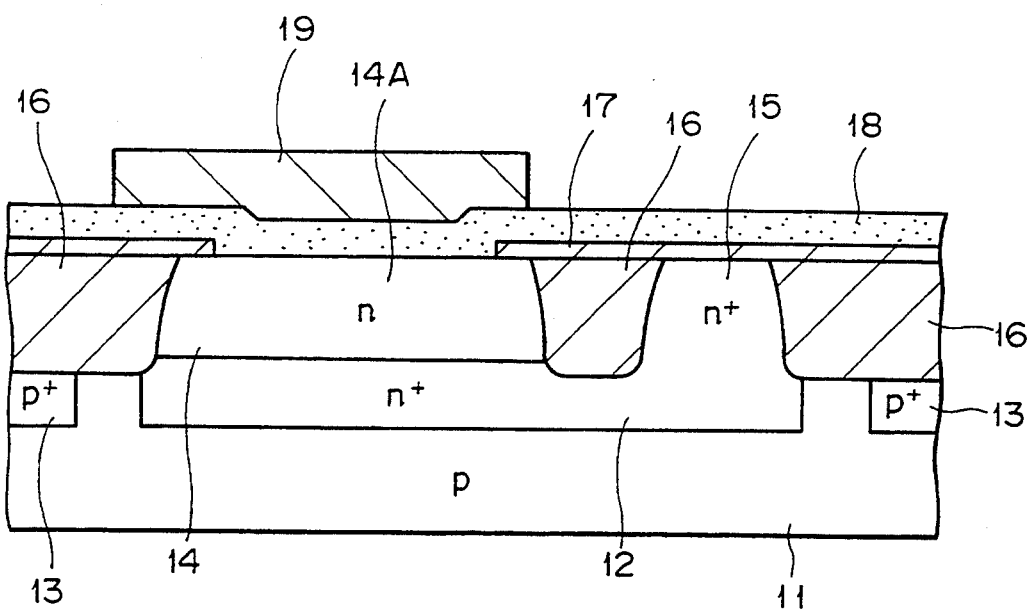
FIGS. 8A to 8D are diagrams illustrating an example of manufacturing processes of a ultra-high speed bipolar transistor.
Figure 8B:
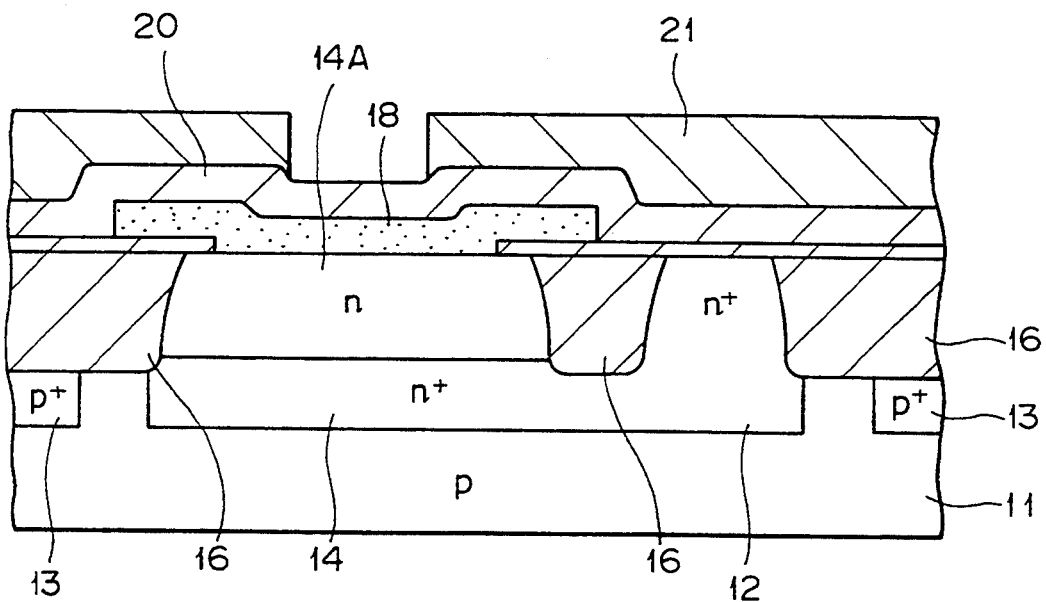
Figure 8C:
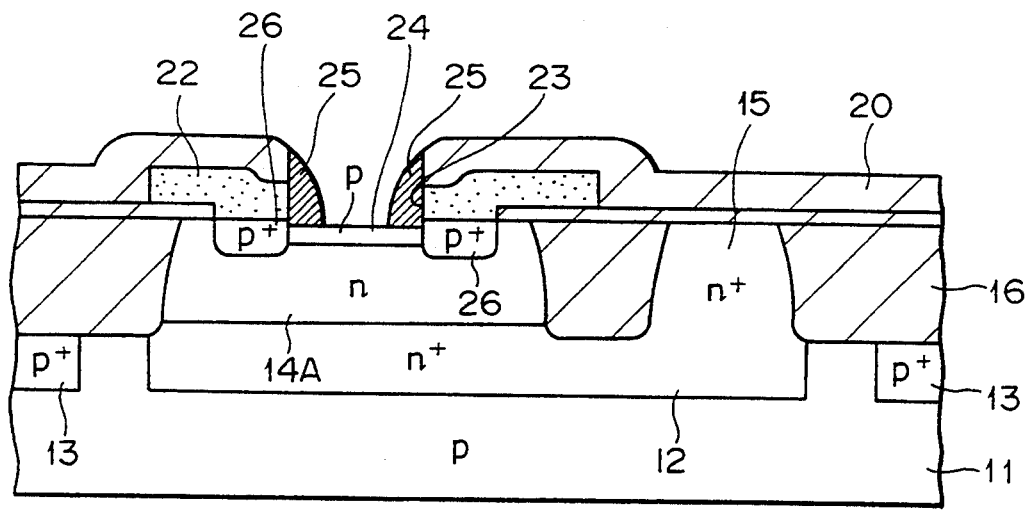
Figure 8D:
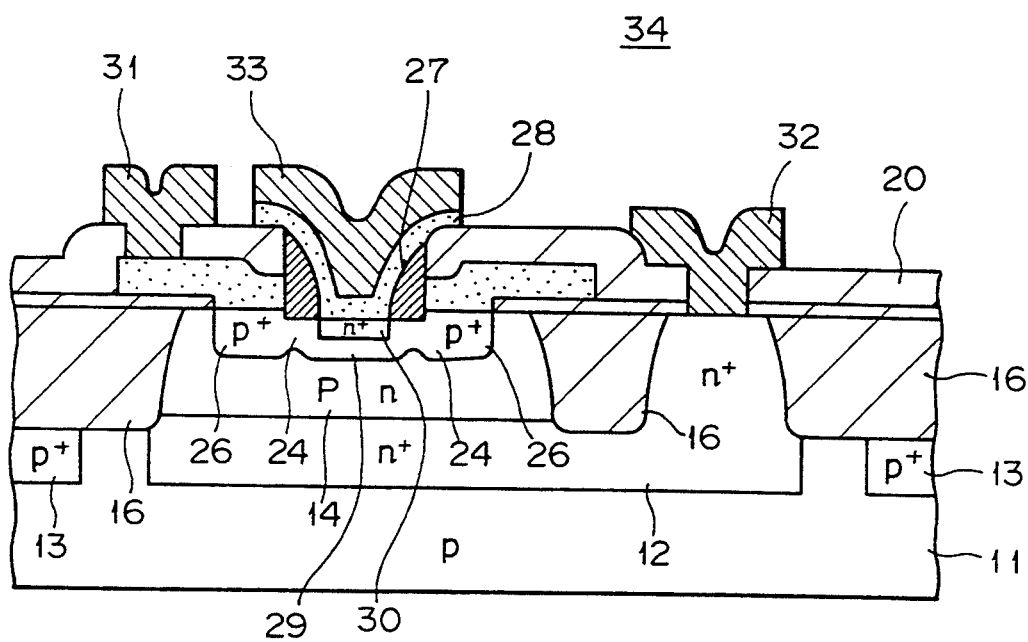

According to the above-described manufacturing method, the surface of the field insulating layer 42 is damaged when the polycrystalline silicon film 43 is subjected to the patterning process by the RIE process, and the surface of the resistor body 45 is polluted and damaged when the resist mask 44 on the resistor body 45 is subjected to the ashing process, but a stable insulating film with a good coverage and a sufficient thickness, i.e., CVD film 51 can be formed by sequentially depositing the silicon nitride film 46 and the silicon dioxide film 47 thereon. Namely, the silicon nitride film 46 can be formed with a good coverage as a dense film even on a surface having been damaged etc., so that the silicon dioxide film 47 formed on the silicon nitride film will be a stable film with good film quality without being influenced by the surface having been damaged and so on. Thus, an interruption of steps of the Al electrodes 49A and 49B due to the coverage can be prevented and also the occurrence of the electromigration can be prevented. Further, the withstand voltage between the resistor 50 and an Al interconnection 8 (see FIG. 7) crossing over the resistor 50 through the CVD film 51 becomes a sufficient value, so that the occurrence of a leak current is prevented therebetween to thereby make it possible to manufacture a stable resistor 50. Further, a parasitic Vth due to the field insulating layer can be obtained safely since the stable CVD film 51 is obtained. Furthermore, the influence of pollution generated in the manufacturing processes on the device can be decreased by the silicon nitride film 46.

FIG. 2 illustrates another embodiment of a method of manufacturing semiconductor devices according to the present invention, and particularly a manufacturing method of a resistor which makes it possible to decrease a resistance value thereof.

Figure 2A:
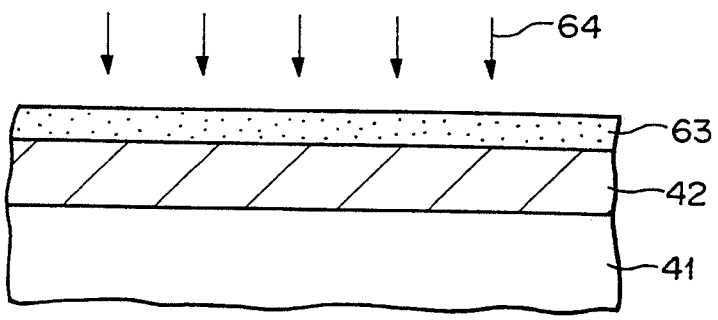
FIGS. 2A to 2E are diagrams illustrating another embodiment of manufacturing processes of a resistor according to the present invention.

In this embodiment, as shown in FIG. 2A, a field insulating layer 42 is formed on a major surface of a semiconductor substrate, e.g., silicon substrate 41 and a polycrystalline silicon film 63 is formed thereon by the CVD process. A resist mask (not shown) selectively having openings at its portions to be a lower resistor is formed on the polycrystalline silicon film 63, then an impurity material 64, e.g., boron (B) (or phosphorus (P), arsenic (As) etc.) is introduced to the polycrystalline silicon film 63 by the ion implantation technique. In this case, an amount of dose of boron (or phosphorus, arsenic etc.) to be introduced by the ion implantation technique is much, so that the state of the polycrystalline silicon film 63 is changed into an amorphous state. Alternately, the amorphous state of the polycrystalline silicon film 63 may be changed into more an amorphous state by introducing silicon by the ion implantation technique etc.

Figure 2B:
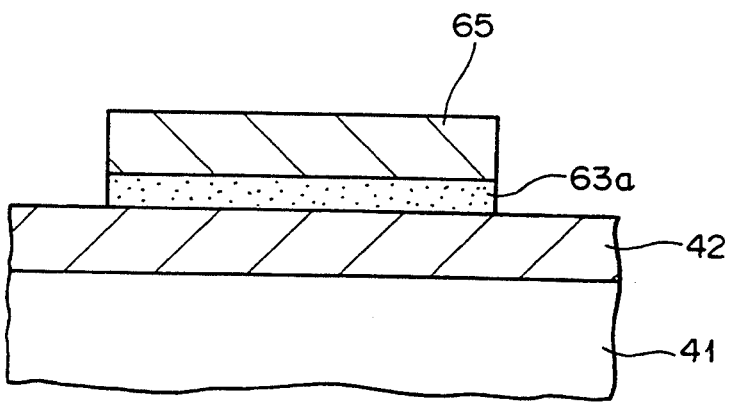

Then, as shown in FIG. 2B, the patterning process through a resist mask 65 is applied thereto by the RIE process etc. such that the amorphous silicon film 63a may remain in a portion to be the resistor body.

Figure 2C:
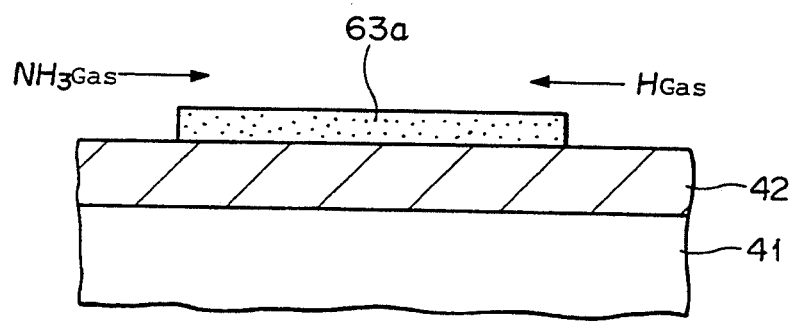

Then, as shown in FIG. 2C, the amorphous silicon film 63a is then heated for about 10 to 60 minutes at a middle-temperature region of about 500° to 800° C. in H-gas atmosphere including, for example, $NH_3$ gas. In this heat treatment in the middle-temperature region, it is considered that the $NH_3$ gas is decomposed and so the hydrogenation of the dangling bond (i.e., hydrogen is combined with the dangling bond) in the polycrystalline silicon film is advanced and also the grain growth is slightly progressed.

Figure 2D:
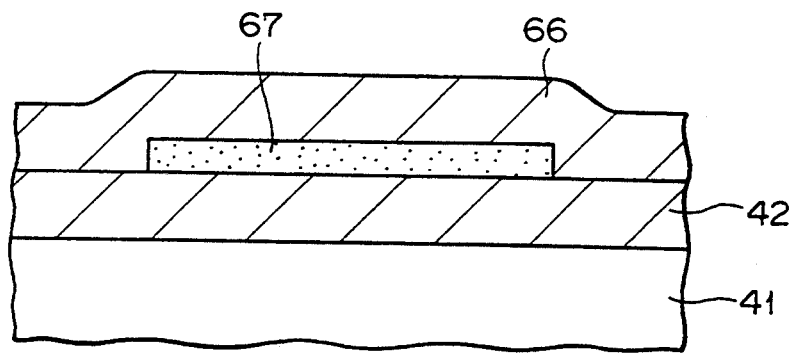
Figure 2E:
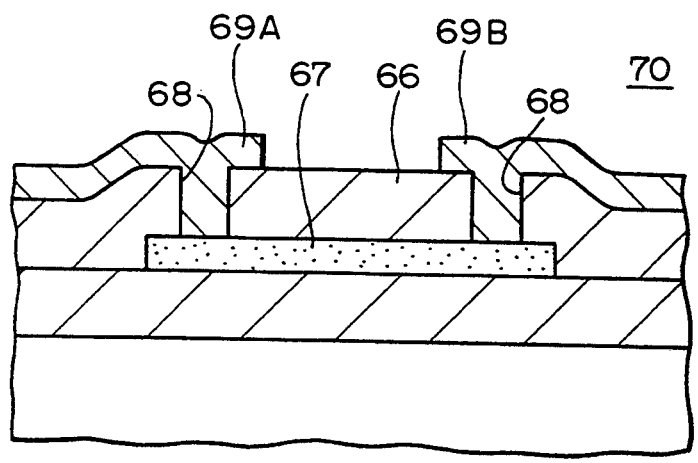
Figure 3A:
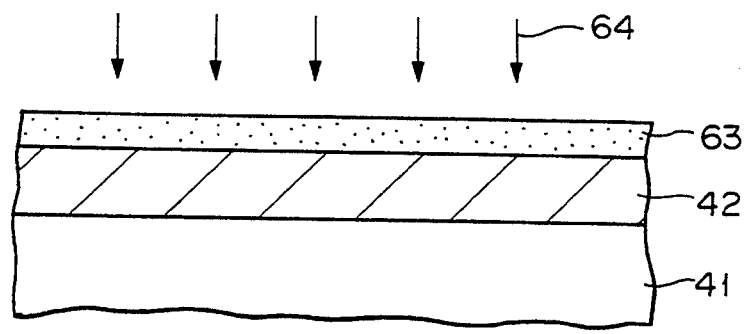
FIGS. 3A to 3E are diagrams illustrating still another embodiment of manufacturing processes of a resistor according to the present invention.
Figure 3B:
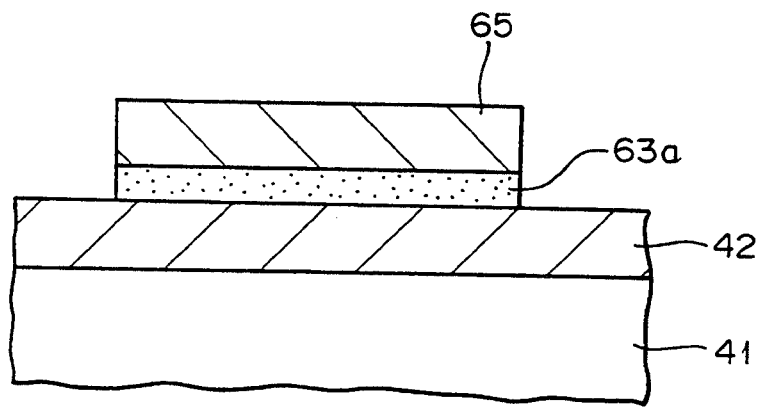
Figure 3C:
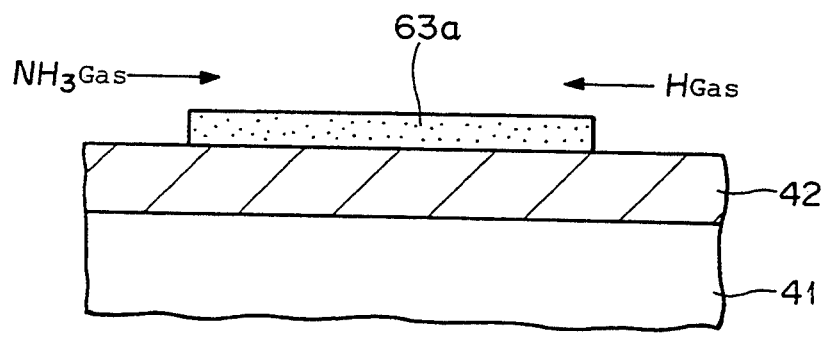
Figure 3D:
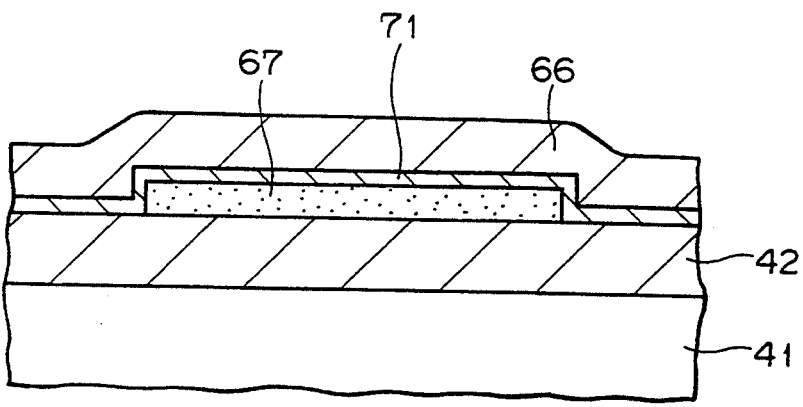
Figure 3E:
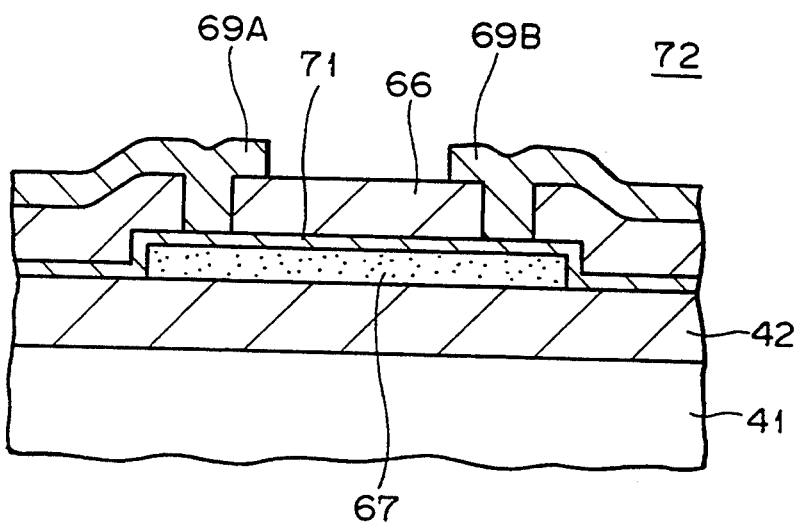

Thereafter, as shown in FIG. 2D, an $SiO_2$ film 66 is deposited thereon by the CVD process and then the device is heated at high temperatures of more than 900° C., e.g., about 1000° C. in $N_2$-gas atmosphere to activate it and progress the grain growth therein, thereby forming a resistor body 67 of the polycrystalline film.

A pair of contact holes 68 are then formed through the $SiO_2$ film 66, and then the device is subjected to the annealing process at temperature of 750° C. in $N_2$-gas atmosphere and further subjected to the annealing-process at a temperature of 335° C. in hydrogen atmosphere. Then, a pair of Al electrodes 69A and 69B are formed at opposite ends of the resistor body 67 by the spattering-process of Al and the patterning process, thereby obtaining a target resistor 70 with a low resistance value by sintering the device at a temperature of 400° C. in an atmosphere including $N_2$-gas and $H_2$-gas.

The resistor 70 can be fabricated simultaneously with the above-described high-speed bipolar transistor. In this case, the polycrystalline silicon film 63 may be formed simultaneously with the polycrystalline silicon film 18 of the bipolar transistor 34, and the high-temperature annealing process at temperature of more than 900° C. may be performed by the same process as the emitter diffusion process of the bipolar transistor 34.

Figure 4:
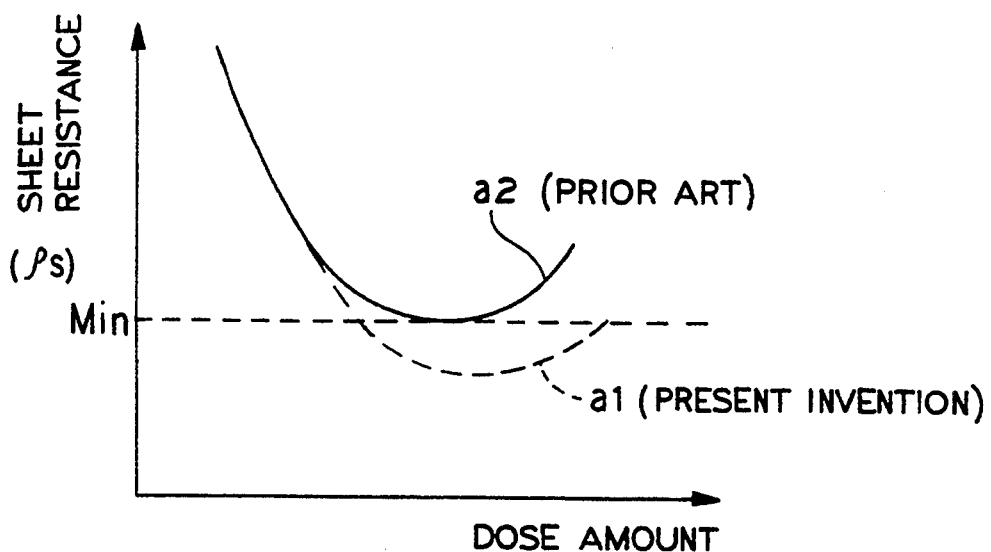
FIG. 4 is a diagram illustrating a dependence of a sheet resistance value of each of a conventional polycrystalline silicon resistor and that of the present invention on an amount of dose of boron.
Figure 5:
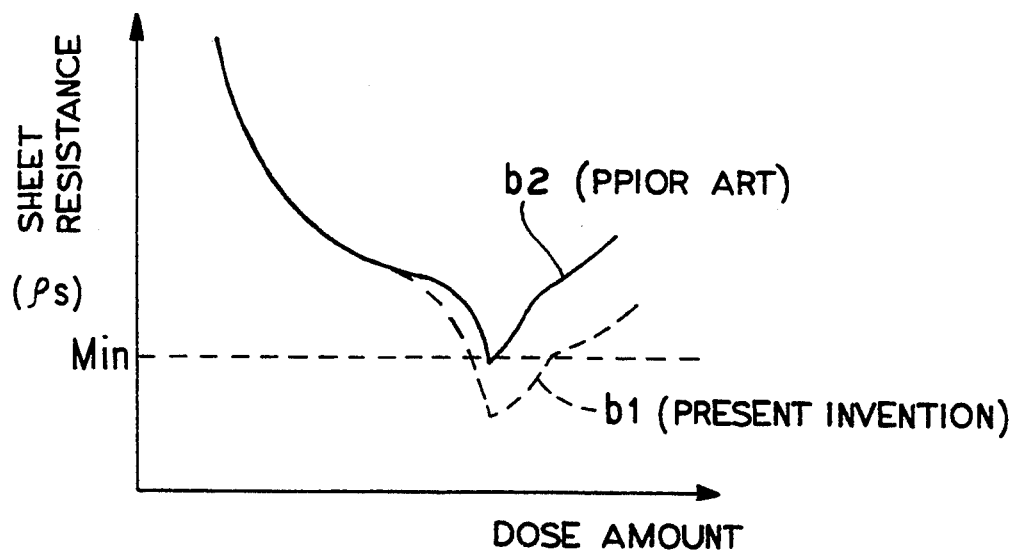
FIG. 5 is a diagram illustrating a dependence of a sheet resistance value of each of a conventional polycrystalline silicon resistor and that of the present invention on an amount of dose of phosphor or arsenic.
Figure 6:
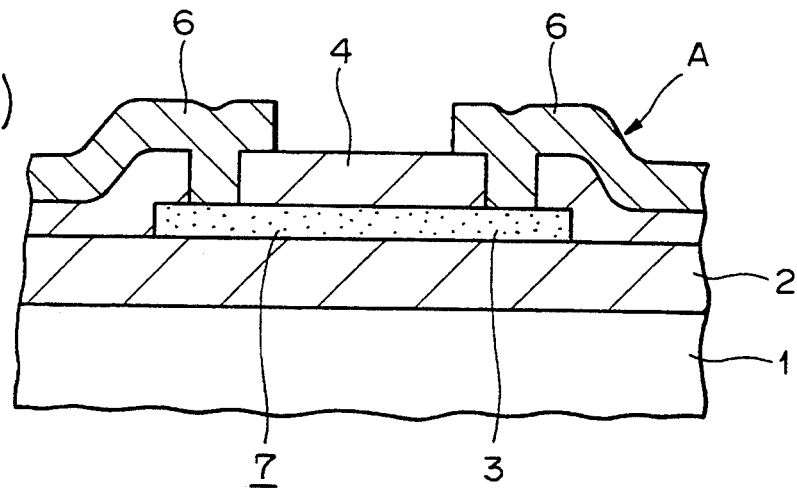
FIG. 6 is a sectional view illustrating an example of a conventional polycrystalline silicon resistor.

According to the above-described manufacturing method, the state of the polycrystalline silicon film 63 is changed into an amorphous state by introducing the impurity 64 therein by the ion implantation technique and then subjected to the patterning process, then heated at temperature range of about 500° to 800° C. in a $H_2$ gas atmosphere including $NH_3$ gas, and thereafter annealed at high temperatures of more than 900° C., so that a resistance value at a region where the impurity 64 is introduced much, i.e., so called heavily dosed region can be decreased as shown by a curve am in FIG. 4 (boron is introduced) or a curve $b_1$ in FIG. 5 (phosphorus or arsenic is introduced). A minimum value of this resistance value can be decreased by about 40%, for example, the reason of which has not been clarified but seems that, by heating the device at the temperature of about 500° to 800° C. in the atmosphere including $NH_3$ gas, segregation of the impurity is suppressed and further the recrystallization, i.e., grain growth in the succeeding high-temperature process for the activation of the amorphous silicon film is progressed. It is advantageous that the heat treatment using the $NH_3$ gas can be made safely even in the heat treatment at a middle temperature region.

FIG. 3 shows another example of the manufacturing method shown in FIG. 2, wherein like parts corresponding to those of FIG. 2 are marked with the same references and therefore need not described. In this embodiment, the manufacturing method is applied to the device of FIG. 1 having the two layers of the silicon nitride film and the silicon dioxide film. Namely, in this embodiment, firstly, processes shown in FIGS. 3A to 3C (corresponding to the processes shown in FIGS. 2A to 2C) are executed, that is, the device is heated at temperature of about 500° to 800° C. in $H_2$ gas atmosphere including $NH_3$ gas, and then an $Si_3N_4$ film 71 and a $SiO_2$ film 66 are sequentially deposited by the low pressure CVD process and the CVD process, respectively, as shown in FIG. 3D. The $Si_3N_4$ film 71 can be formed continuously after the process shown in FIG. 3C by introducing $SiH_4$ gas. Thereafter, as in the same manner as the processes of FIG. 2, contact holes are formed and then Al electrodes 69A and 69B are formed, thereby obtaining a target resistor 72 shown in FIG. 3D. According to the embodiment of FIG. 3, a resistance value at the highly dosed region can be decreased progressively likewise the embodiment of FIG. 2, and also there is provided the resistor 72 having an insulating film with good coverage.

In the above embodiment, the heat treatment at the middle temperature range is performed in the $H_2$-gas atmosphere including $NH_3$ gas in the process of FIG. 2C, but this heat treatment may be performed in a gas atmosphere including only $NH_3$ gas. Further, $SiH_4$ gas, HCl gas, $SiH_2Cl_2$ gas or the like may be used instead of the $NH_3$ gas, and so the heat treatment may be performed in a gas atmosphere including only $SiH_4$ gas, HCl gas or $SiH_2Cl_2$ gas, and also may be performed in the $H_2$-gas atmosphere including these gases. Furthermore, the heat treatment may be performed in a gas atmosphere including only $H_2$ gas.

We claim:

1. A method of manufacturing a semiconductor device, comprising the steps of:
   ion-implanting an impurity into a semiconductor film to be a resistor to change said semiconductor film from polycrystalline to amorphous;
   patterning said implanted semiconductor film to form the shape of a resistor;
   first heat-treating said patterned semiconductor film in atmosphere including hydrogen gas and ammonia gas at a temperature of 500° to 800° C.; and
   thereafter second heat-treating said heat-treated semiconductor film to activate said semiconductor film, thereby forming said resistor.

* * * * *